(12) United States Patent
Wang et al.

(10) Patent No.: US 9,455,399 B2
(45) Date of Patent: Sep. 27, 2016

(54) GROWTH OF ANTIMONY DOPED P-TYPE ZINC OXIDE NANOWIRES FOR OPTOELECTRONICS

(71) Applicant: Georgia Tech Research Corporation, Atlanta, GA (US)

(72) Inventors: Zhong Lin Wang, Atlanta, GA (US); Ken Pradel, Atlanta, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 342 days.

(21) Appl. No.: 14/024,798

(22) Filed: Sep. 12, 2013

(65) Prior Publication Data

US 2014/0072756 A1 Mar. 13, 2014

Related U.S. Application Data

(60) Provisional application No. 61/700,132, filed on Sep. 12, 2012.

(51) Int. Cl.
| | |
|---|---|
| *H01L 41/18* | (2006.01) |
| *H01L 41/39* | (2013.01) |
| *H01L 41/08* | (2006.01) |
| *H01L 41/31* | (2013.01) |

(Continued)

(52) U.S. Cl.
CPC ........... *H01L 41/183* (2013.01); *H01L 41/082* (2013.01); *H01L 41/187* (2013.01); *H01L 41/31* (2013.01); *H01L 41/39* (2013.01); *H01L 41/113* (2013.01); *Y10T 428/23993* (2015.04)

(58) Field of Classification Search
USPC .......................................................... 428/97
See application file for complete search history.

(56) References Cited

U.S. PATENT DOCUMENTS

| | | |
|---|---|---|
| 6,586,095 B2 | 7/2003 | Wang et al. |
| 7,220,310 B2 | 5/2007 | Wang et al. |

(Continued)

OTHER PUBLICATIONS

Jeon et al., "MEMS power generator with transverse mode thin film PCT," Science Direct, vol. 122, Issue 1, Jul. 29, 2005, pp. 16-22.

(Continued)

*Primary Examiner* — Lynda Salvatore
(74) *Attorney, Agent, or Firm* — Bryan W. Bockhop; Bockhop Intellectual Property Law, LLC

(57) ABSTRACT

In a method of growing p-type nanowires, a nanowire growth solution of zinc nitrate ($Zn(NO_3)_2$), hexamethylenetetramine (HMTA) and polyethylenemine (800 $M_w$ PEI) is prepared. A dopant solution to the growth solution, the dopant solution including an equal molar ration of sodium hydroxide (NaOH), glycolic acid ($C_2H_4O_3$) and antimony acetate ($Sb(CH_3COO)_3$) in water is prepared. The dopant solution and the growth solution combine to generate a resulting solution that includes antimony to zinc in a ratio of between 0.2% molar to 2.0% molar, the resulting solution having a top surface. An ammonia solution is added to the resulting solution. A ZnO seed layer is applied to a substrate and the substrate is placed into the top surface of the resulting solution with the ZnO seed layer facing downwardly for a predetermined time until Sb-doped ZnO nanowires having a length of at least 5 μm have grown from the ZnO seed layer.

11 Claims, 2 Drawing Sheets

(51) Int. Cl.
*H01L 41/187* (2006.01)
*H01L 41/113* (2006.01)

(56) References Cited

U.S. PATENT DOCUMENTS

| | | |
|---|---|---|
| 7,351,607 B2 | 4/2008 | Wang et al. |
| 7,705,523 B2 | 4/2010 | Wang et al. |
| 7,898,156 B2 | 3/2011 | Wang et al. |
| 8,039,834 B2 | 10/2011 | Wang et al. |
| 2003/0205657 A1 | 11/2003 | Voisin |
| 2004/0127025 A1 | 7/2004 | Crocker, Jr. et al. |
| 2005/0188751 A1 | 9/2005 | Puskas |
| 2005/0242366 A1 | 11/2005 | Parikh et al. |
| 2008/0067618 A1 | 3/2008 | Wang et al. |
| 2009/0066195 A1 | 3/2009 | Wang et al. |
| 2009/0115293 A1 | 5/2009 | Wang et al. |
| 2009/0179523 A1 | 7/2009 | Wang et al. |
| 2009/0209303 A1 | 8/2009 | Kroll et al. |
| 2010/0026142 A1 | 2/2010 | Jones et al. |
| 2010/0117488 A1 | 5/2010 | Wang et al. |
| 2010/0139750 A1 | 6/2010 | Kim et al. |
| 2010/0141095 A1 | 6/2010 | Park |
| 2010/0147371 A1 | 6/2010 | Cho |
| 2010/0171095 A1 | 7/2010 | Wang et al. |
| 2010/0191153 A1 | 7/2010 | Sanders et al. |
| 2010/0253184 A1 | 10/2010 | Choi et al. |
| 2010/0258160 A1 | 10/2010 | Wang et al. |
| 2010/0314968 A1 | 12/2010 | Mohamadi |
| 2011/0050042 A1 | 3/2011 | Choi et al. |
| 2011/0107569 A1 | 5/2011 | Wang et al. |

OTHER PUBLICATIONS

Gao et al., Nanoarchitectures of semiconducting and piezoelectric zinc oxide, J. Applied Physics 97, 044304 (2005).
Wang et al., "Large-Size Liftable Inverted-Nanobowl Sheets as Reusable Masks for Nanolithography," Nano Letters, vol. 5, No. 9, 2005, 1748-1788.
Lao et al., "Formation of double-side teethed nanocombs of ZnO and self-catalysis of Zn-terminated polar surface," Chemical Physics Letters, Elsevier B.V., 2005.
Jeon et al., "MEMS power generator with transverse mode thin film PZT," Sensors and Actuators A Physical, Elsevier, (2005).
Lao et al., "Formation of double-side teethed nanocombs of ZnO and self-calalysis of Zn-terminated polar surface," Chemical Physics Letters (Science Direct), (Abstract), 2007.
Wang et al., "Large-Size Liftable Inverted-Nanobowl Sheets as REusable Masks for Nanolithography," Nano Letters, vol. 5, (Abstract), 2005.
Wang et al., "Piezoelectric Nanogenerators Based on Zinc Oxide Nanowire Arrays," Science, vol. 312, pp. 242-245, Apr. 14, 2006.
Wang et al., "An aqueous solution-based doping strategy for large-scale synthesis of Sb-doped ZnO nanowires," Nanotechnology, vol. 22, pp. 1-8, Apr. 1, 2011.

GROWTH OF ANTIMONY DOPED P-TYPE ZINC OXIDE NANOWIRES FOR OPTOELECTRONICS

CROSS-REFERENCE TO RELATED APPLICATION(S)

This application claims the benefit of U.S. Provisional Patent Application Ser. No. 61/700,132, filed Sep. 12, 2012, the entirety of which is hereby incorporated herein by reference.

STATEMENT OF GOVERNMENT INTEREST

This invention was made with government support under agreement No. DE-FG02-07ER46394, awarded by the Department of Energy. The government has certain rights in the invention.

BACKGROUND OF THE INVENTION

1. Field of the Invention

The present invention relates to nanostructures and, more specifically, to Sb-doped ZnO nanowires.

2. Description of the Related Art

Piezoelectric semiconductors with wurtzite or zinc blend structures such as ZnO, GaN, InN and ZnS have attracted increased attention in the burgeoning field of piezotronics and piezo-phototronics, which can be attributed to their numerous robust synthesis methods and potential for realizing novel applications by coupling their piezoelectric and semiconductor properties. The working principle of piezotronics lies in the modulation/gating of carrier transport across the barriers/junctions through piezoelectric-polarization-induced electric field (piezopotential) under strain, which is known as the piezotronic effect. This provides a new mechanism for controlling charge carrier transport by mechanical strain in addition to the well-known electrically-induced "field-effect." A wide variety of novel applications based on the piezotronic effect have been demonstrated including strain sensors, logic units, memory cells, electrochemical devices, and tactile imaging arrays. However, the aforementioned piezotronic devices were all fabricated using intrinsically n-type ZnO and few studies of piezotronics based on p-type materials, especially p-type ZnO have been done. In order to develop a full understanding of the theory of piezotronics, and enable novel applications in electronics, optoelectronics, smart MEMS/NEMS and human-machine interfacing it is important to investigate the feasibility of p-type piezoelectric semiconductors for piezotronic applications.

Different types of p-type doping in ZnO nanowires has been previously achieved through a variety of methods including chemical vapor deposition and pulsed laser deposition. However, the doping often suffers from poor stability due to the formation of low energy donor impurities such as hydrogen interstitials and oxygen vacancies ($V_O$). Group I elements in the Zn site should act as acceptors, but have been shown to form interstitials due to their small atomic radii, making them act as donors instead. Of the group V elements, nitrogen has often been considered the most promising candidate for achieving stable p-type doped ZnO due to its similar atomic radius to oxygen. However, there has been difficulty in reproducing them. Despite their much larger atomic radii, arsenic (As) and antimony (Sb) have both been demonstrated as promising candidates for p-type doping in ZnO. Rather than occupying an O site, it has been suggested that an $As/Sb_{Zn}-2V_{Zn}$ complex forms. Recently, p-type ZnO nanowires doped with Sb were demonstrated through low-temperature solution-phase process, using a glycolate ligand to control the release rate of dopant. However, those solution-grown nanowires were only a few μm in length, making manipulation and further experimentation difficult.

Therefore, there is a need for a method of growing p-type doped nanowires that are longer and more stable.

SUMMARY OF THE INVENTION

The disadvantages of the prior art are overcome by the present invention which, in one aspect, is a method of growing p-type nanowires, in which a nanowire growth solution of zinc nitrate ($Zn(NO_3)_2$), hexamethylenetetramine (HMTA) and polyethylenemine (800 $M_w$ PEI) is prepared. A dopant solution to the growth solution, the dopant solution including an equal molar ration of sodium hydroxide (NaOH), glycolic acid ($C_2H_4O_3$) and antimony acetate ($Sb(CH_3COO)_3$) in water is prepared. The dopant solution is mixed with the growth solution in a container to generate a resulting solution that includes antimony to zinc in a ratio of between 0.2% molar to 2.0% molar, the resulting solution having a top surface. An ammonia solution is added to the resulting solution. A ZnO seed layer is applied to a substrate and the substrate is placed into the top surface of the resulting solution with the ZnO seed layer facing downwardly for a predetermined time until Sb-doped ZnO nanowires having a length of at least 5 μm have grown from the ZnO seed layer.

In another aspect, the invention is a method of growing a nanostructure, in which a nanowire growth solution of 25 mM zinc nitrate ($Zn(NO_3)_2$), 12.5 mM hexamethylenetetramine (HMTA), 5 mM polyethylenemine (800 $M_w$ PEI) and 0.8 M ammonium hydroxide is prepared. A dopant solution to the growth solution, the dopant solution including an equal molar ration of sodium hydroxide (NaOH), glycolic acid ($C_2H_4O_3$) and antimony acetate ($Sb(CH_3COO)_3$) in water is prepared. The antimony acetate ($Sb(CH_3COO)_3$) is added to the dopant solution in a 1:12 molar ratio. The dopant solution is mixed with the growth solution in a container to generate a resulting solution that includes antimony to zinc in a ratio of between 0.2% molar to 2.0% molar. The resulting solution has a top surface. A ZnO seed layer is sputtered on to an $SiO_2$ substrate. The substrate is placed into the top surface of the resulting solution with the ZnO seed layer facing down for about 24 hours until Sb-doped ZnO nanowires having a length of at least 5 μm have grown from the ZnO seed layer. The substrate is removed from the resulting solution and the Sb-doped ZnO nanowires are rinsed in deionized water. The Sb-doped ZnO nanowires are annealed at about 850° C. for about one hour.

In yet another aspect, the invention is a nano-structure that includes a substrate. An elongated zinc oxide nanowire extends from the substrate. The elongated zinc oxide nanowire includes an antimony dopant and has a length of at least 5 μm.

These and other aspects of the invention will become apparent from the following description of the preferred embodiments taken in conjunction with the following drawings. As would be obvious to one skilled in the art, many variations and modifications of the invention may be effected without departing from the spirit and scope of the novel concepts of the disclosure.

DETAILED DESCRIPTION OF THE INVENTION

Figure 1:
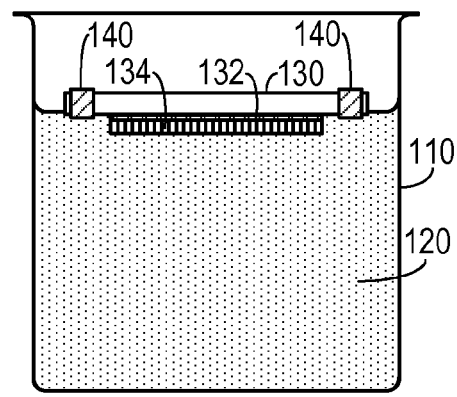
FIG. 1 is a schematic drawings showing one part of a method of making nanowires.

A preferred embodiment of the invention is now described in detail. Referring to the drawings, like numbers indicate like parts throughout the views. Unless otherwise specifically indicated in the disclosure that follows, the drawings are not necessarily drawn to scale. As used in the description herein and throughout the claims, the following terms take the meanings explicitly associated herein, unless the context clearly dictates otherwise: the meaning of "a," "an," and "the" includes plural reference, the meaning of "in" includes "in" and "on."

As shown in FIG. 1, one embodiment is a method of growing ultra-long p-type ZnO nanowires 134 up to 60 µm in length using a low-temperature solution growth method. In one experimental embodiment, doped ZnO nanowires 134 were synthesized using a modified hydrothermal method. To produce longer wires, high concentrations of ammonia were added to the growth solution to inhibit self-nucleation. A solution of 25 mM zinc nitrate ($Zn(NO_3)_2$), 12.5 mM hexamethylenetetramine (HMTA), 5 mM polyethylenemine (800 $M_w$ PEI) and 0.8 M ammonium hydroxide was prepared. The dopant solution was prepared by mixing an equal molar ratio of sodium hydroxide (NaOH) and glycolic acid ($C_2H_4O_3$) in water. Antimony acetate ($Sb(CH_3COO)_3$) was then added to this solution in a 1:12 molar ratio, which were combined in a beaker 110 to form a resulting solution 120. All chemicals were purchased from Sigma-Aldrich and Alfa Aesar, and used as received without further purification. Dopant with concentration between 0.2 and 2% molar relative to zinc was added to the solution. The nanowires 134 were grown on a substrate 130 made from a silicon wafer (in other embodiments, the substrate could include $SiO_2$ or a flexible polymer, such as polyethylene terephthalate (PET)) with a 100-nm thick sputtered ZnO seed layer 132 for 24 hours in a 95° C. oven. With certain types of substrates, such as polymer substrates, an indium tin oxide (ITO) layer may be applied to the substrate prior to sputtering the ZnO seed layer to improve adhesion. Teflon tape 140 was added to the substrate 132 to improve buoyancy.

Figure 2:
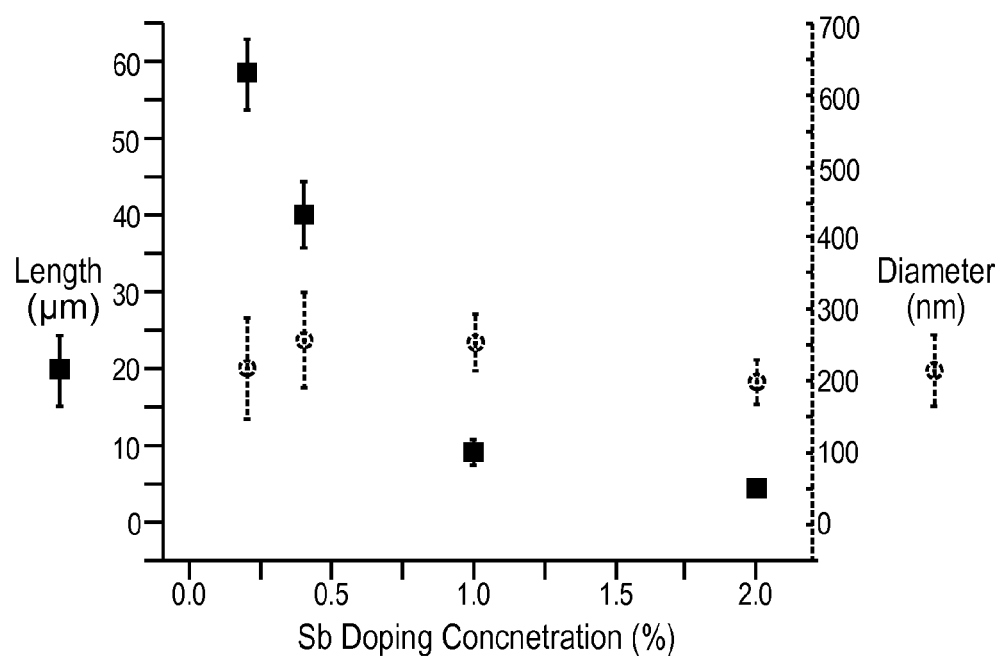
FIG. 2 is a graph relating length and diameter of nanowires to dopant solution concentration.
Figure 3:
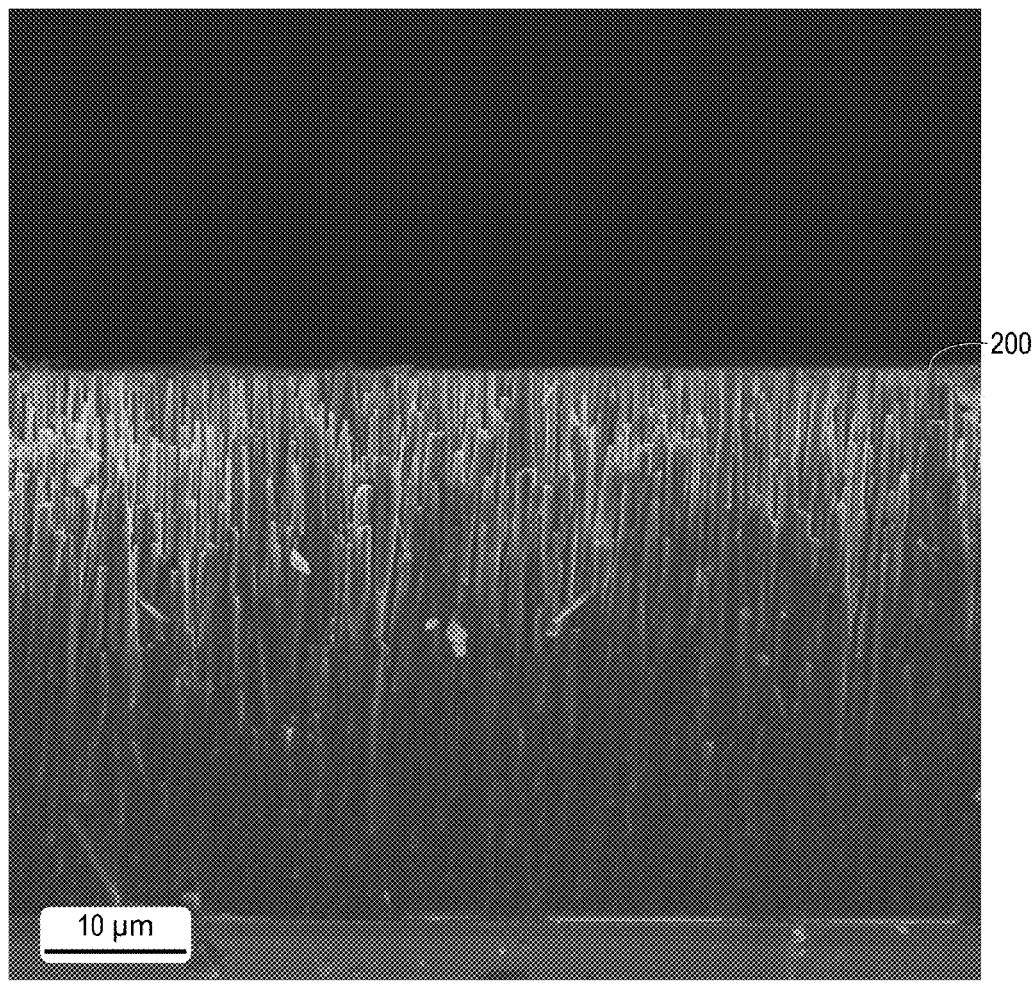
FIG. 3 is a micrograph of Sb-doped nanowires.

A shown in FIG. 2, considerable improvement in nanowire length can be seen, with wires reaching lengths of up to 60 µm at 0.2% doping. As the doping concentration increased, the wire length tended to decrease, while the diameter remained constantly between 200-300 nm. A micrograph of resulting Sb-doped nanowires 200 is shown in FIG. 3.

Voids can be observed inside the as-synthesized nanowires, suggesting that the doping mechanism is the same despite the differences in growth solution and length of as-fabricated nanowires. This co-doping reaction explains the excellent stability of p-type Sb-doped nanowires generated from this method. The concentration of voids increases when the dopant concentration increases from 0.2 to 2%. Significantly smaller voids are observed in the heavily doped sample as well. In the higher doped samples, there will be more nucleation events due to the increased dopant concentration. Because of the overlapping diffusion fields of the different nucleation sites in the higher doped samples, the growth rate will quickly drop off leading to smaller dopant planes, and thus smaller voids. Due to the lower number of nucleation events in the lower doped sample, there is no diffusion overlap, allowing for faster growth of dopant planes, which form larger voids. Since the dopant is only incorporated onto the bottom face of the void, a large number of small voids will incorporate more dopant into the nanowire than a few large ones.

To characterize the charge carrier properties of as-synthesized ZnO nanowires, single nanowire field effect transistors (FET) with a back-gate configuration were fabricated. The ZnO nanowires were annealed at 850° C. in atmosphere to activate the dopants, and then re-dispersed in ethanol using ultrasonication, to transfer them to the Si substrate. A 200 nm thick $SiO_2$ wafer was thermally-grown on heavily doped silicon substrates and acted as the gate dielectric. Source and drain electrodes (200-nm Ti for undoped nanowires and 200-nm Ni for doped nanowires) were defined by electron-beam lithography and deposited via electron-beam evaporation and standard lift-off processes. The electrical transport characteristics of the single nanowire FETs was measured using a semiconductor parameter analyzer (Keithley 4200), with results for both undoped (0%) and doped samples (0.2% and 1%). The undoped ZnO nanowire-FET exhibited typical n-type characteristics with a threshold voltage of −2.8 V and on/off ratio of $10^4$. The mobility and carrier concentration were calculated as 3.22 $cm^2 \cdot V^{-1} \cdot s^{-1}$ and $2.2 \times 10^{17}$ $cm^{-3}$ respectively. Clear p-type characteristics can be observed for both 0.2% and 1% Sb-doped ZnO nanowire-FETs. The on/off ratio, threshold voltage, mobility and carrier concentration of 0.2% doped sample are found to be $10^5$, 2.1 V, 0.82 $cm^2 \cdot V^{-1} \cdot s^{-1}$ and $2.6 \times 10^{17}$ $cm^{-3}$ respectively, while the corresponding values for 1% doped samples are $10^4$, 2.0 V, 1.24 $cm^2 \cdot V^{-1} \cdot s^{-1}$ and $3.8 \times 10^{17}$ $cm^{-3}$. The electrical transport characteristic of 0.2% doped sample was remeasured after 2 months, which demonstrates stable p-type behavior.

In one experimental embodiment, a Pt-coated Si AFM tip (AFM: MFP-3D from Asylum Research) was scanned across an array of as-grown nanowires in contact mode with a constant normal force of 5 nN. A 500 MΩ resistor was added to the circuit to calculate the voltage based on the output current. Electrical signals with opposite polarities were observed in undoped and doped wires. When the AFM tip bends a piezoelectric semiconductor nanowire, positive and negative piezopotential is induced along the stretched and compressed sides, respectively. In an n-type nanowire, the conduction band electrons tend to accumulate on the stretched side. Consequently, the positive piezopotential at the stretched side is partially screened by free charge carriers while the negative piezopotential is preserved. The remnant positive piezopotential due to incomplete screening by the free electrons results in a reversely-biased Schottky barrier between AFM tip and nanowire, which prevents the flow of electrons across the interface. When the AFM tip scans across the top of the nanowires and touches the compressed side of the nanowire, negative piezopotential at that side gives rise to the forward-biased Schottky barrier. As a result, negative transient current spikes can be observed in external load due to the transport of free electrons from the semiconductor to the metal tip. Conversely, in nanowires with finite p-type doping, the holes tend to accumulate at the negative piezopotential side. In this case, the negative piezopotential at the compressed side is partially screened while the positive piezopotential is preserved. Unlike n-type semiconductors, the Schottky barrier at the metal/p-type semiconductor interface is forward-biased when the semiconductor side is positively-biased. Therefore, positive piezopotential in bent p-type nanowires will drive the flow of charge carriers from the metal tip to the nanowires through the external load and positive transient current spikes can be observed. As a result, one can easily identify the majority carrier based on the sign of measured current during conductive AFM scanning. It is also interesting to note that the outputs from 1% doped nanowires were an order of magnitude lower than those from the 0.2% doped samples, which can be attributed to the increased screening of strain-induced piezopotential in more heavily doped nanowires. By characterizing the electrical transport and piezoelectric response measurements, the p-type doping of our ultra-long nanowires was confirmed.

Piezotronic devices based on modulation of charge carrier transport by strain-induced piezopotential can be made with n-type materials. Using the method disclosed herein, p-type ZnO nanowires based piezotronic transistors can be made, which extends the concept of piezotronics and its potential applications in the fields of flexible electronics and optoelectronics. As-prepared Sb-doped ZnO nanowires were sonicated in ethanol and transferred onto PET substrates. Titanium (200 nm thick) was chosen to form Schottky contacts with single p-type ZnO nanowires. The nanowire was attached laterally to a substrate, and its two ends bonded with metal. In such a configuration, since the diameters of p-type ZnO nanowires (<1 μm) is significantly smaller than the thickness of the PET substrates (~500 μm), strain induced in the p-type ZnO nanowires is dictated by the substrate. Strain values in a single nanowire are calculated according to previous studies with tensile strain defined as positive and compressive strain defined as negative. The polarity of the applied bias is with respect to drain electrode. For positive drain bias, the current through the device increased under tensile strain, and decreased with compressive strain. Conversely, under negative drain bias, the opposite trend was observed, with the current increasing under compressive strain, and decreasing with increased tension. The "gating" effect of external strain on charge carrier transport in p-type ZnO nanowire piezotronic devices is demonstrated in which current values (I) in a device under various strains were measured at fixed bias (0.8 V and −0.8 V here). The corresponding strain-induced change in Schottky barrier height (SBH) was calculated, demonstrating a change of 53 meV in SBH at drain contact with an applied compressive strain of 0.68%. The Schottky barrier at the metal/p-type semiconductor interface causes the band structure to bend downwards. The transport properties of the device are dictated by the reversely biased contact due to its large voltage drop and are sensitive to changes in its SBH. When the device is biased by an external power source, the quasi-Fermi levels at both contacts are separated. When tensile strain is applied to the device, due to the orientation of the c-axis of the p-type nanowire, negative piezoelectric polarization charges are induced at the drain contact. If the doping level inside the nanowire is finite, these immobile ionic charges will only be partially screened and can attract the majority charge carriers, holes, towards the metal-semiconductor interface, which decreases the SBH at the drain contact. At the same time, positive piezoelectric polarization charges are induced at the source contact, which results in an increased SBH at the source contact. When compressive strain is applied to the device, on the other hand, positive piezoelectric polarization charges are induced at the drain contact, which depletes holes near the metal-semiconductor interface and increases the SBH at drain contact. Simultaneously, negative piezoelectric polarization charges are induced at source contact, lowering the SBH at source contact. This leads to the observed I-V curves in which the applied mechanical strain functions as the controlling gate signal to modulate the carrier transport in p-type ZnO nanowires based piezotronic transistors, the core concept of piezotronics.

The piezoelectric-polarization-induced piezopotential in strained p-type ZnO nanowires can also drive the flow of electrons through an external load without an applied electric bias, which can be utilized to harvest mechanical energy and converts it into electricity. Flexible piezoelectric nanogenerators (NGs) based on an array of p-type ZnO nanowires were fabricated to demonstrate this concept. In one experimental embodiment, a layer of ITO (120 nm) was first sputtered onto PET substrates serving as the bottom electrode. A ZnO seed layer (125 nm) was subsequently sputtered onto the ITO layer. An array of p-type ZnO nanowires was then grown through the hydrothermal method described previously, except the growth time was decreased to 2 hours for the 0 and 0.2% doped samples to produce wires of comparable length to the 1% doped samples. After growth, the as-synthesized nanowires array was encapsulated with a PMMA layer and a layer of gold (50 nm) was evaporated onto the baked PMMA to serve as the top electrode. Piezoelectric output was produced by applying periodic mechanical strain to the device. Due to the low doping concentration, no significant difference was seen between the outputs of the 0 and 0.2% doped devices. However, there was a noticeable drop in output for the 1% doped sample. This can be attributed to the more significant screening of the induced piezo-polarization charges by the higher concentration of free charge carriers. Unlike the aforementioned AFM measurements for transversely bent ZnO nanowires, no reversal in polarity of the outputs were observed here for n- and p-type samples due to the fundamental differences between these two scenarios. Because of the device structure and operation scheme of the flexible array NG, the strain induced piezopotential is distributed along the axial direction of the nanowires, regardless of doping, which is different from the transverse distribution of piezopotential in the AFM study. The distribution of piezopotential induced along the nanowires is dictated by the crystal structure and orientation, and not the type of majority carriers. As a result, the piezopotential of both undoped and doped samples will have the same polarity at corresponding contacts under the same straining conditions. Free electrons in undoped samples and holes in doped ones will only screen the piezopotential at their corresponding contacts, and will not change the direction of the electron flow through the external circuit, which defines the polarity of the measured electrical outputs.

The above described embodiments, while including the preferred embodiment and the best mode of the invention known to the inventor at the time of filing, are given as illustrative examples only. It will be readily appreciated that many deviations may be made from the specific embodiments disclosed in this specification without departing from the spirit and scope of the invention. Accordingly, the scope of the invention is to be determined by the claims below rather than being limited to the specifically described embodiments above.

What is claimed is:

1. A method of growing p-type nanowires, comprising the steps of:
    (a) preparing a nanowire growth solution of zinc nitrate (Zn(NO$_3$)$_2$), hexamethylenetetramine (HMTA) and polyethylenemine (800 M$_w$ PEI);
    (b) preparing a dopant solution to the growth solution, the dopant solution including an equal molar ration of sodium hydroxide (NaOH), glycolic acid ($C_2H_4O_3$) and antimony acetate ($Sb(CH_3COO)_3$) in water;

(c) mixing the dopant solution with the growth solution in a container to generate a resulting solution that includes antimony to zinc in a ratio of between 0.2% molar to 2.0% molar, the resulting solution having a top surface;

(d) adding an ammonia solution to the resulting solution;

(e) applying a ZnO seed layer to a substrate; and (f) placing the substrate into the top surface of the resulting solution with the ZnO seed layer facing downwardly for a predetermined time until Sb-doped ZnO nanowires having a length of at least 5 µm have grown from the ZnO seed layer.

2. The method of claim 1, wherein the predetermined time is about 24 hours.

3. The method of claim 1, wherein the substrate comprises a material selected from a group consisting of: $SiO_2$ and a flexible polymer.

4. The method of claim 1, further comprising the steps of:
(a) removing the substrate from the resulting solution;
(b) rinsing the Sb-doped ZnO nanowires in deionized water; and
(c) annealing the Sb-doped ZnO nanowires at a predetermined temperature.

5. The method of claim 4, wherein the predetermined temperature is about 850° C.

6. The method of claim 1, further comprising the step of applying a buoyant material to the substrate.

7. The method of claim 1, wherein the zinc nitrate ($Zn(NO_3)_2$) is 25 mM in solution, the hexamethylenetetramine (HMTA) is 12.5 mM in solution, the polyethylenemine (800 $M_w$ PEI) is 5 mM in solution and the ammonium hydroxide is 0.8 M in solution.

8. The method of claim 1, wherein the antimony acetate ($Sb(CH_3COO)_3$) is added to the dopant solution in a 1:12 molar ratio.

9. The method of claim 1, wherein the applying a ZnO seed layer step comprises the step of sputtering ZnO direct onto the substrate.

10. The method of claim 1, wherein the substrate comprises a flexible material and wherein the applying a ZnO seed layer step comprises the steps of:
(a) applying an indium tin oxide (ITO) layer to the substrate; and
(b) sputtering ZnO onto the indium tin oxide (ITO) layer.

11. The method of claim 1, further comprising the step of preheating the resulting solution to about 95° C. prior to the step of placing the substrate into the top surface of the resulting solution.

* * * * *